United States Patent
Kim et al.

(10) Patent No.: US 10,153,283 B2
(45) Date of Patent: Dec. 11, 2018

(54) SEMICONDUCTOR DEVICES INCLUDING CONDUCTIVE CONTACTS AND INSULATION PATTERNS ARRANGED IN AN ALTERNATING SEQUENCE AND METHODS OF FABRICATING THE SAME

(71) Applicant: Samsung Electronics Co., Ltd., Suwon-si, Gyeonggi-do (KR)

(72) Inventors: Nam-Gun Kim, Yongin-si (KR); Chanmi Lee, Suwon-si (KR); Joonkyu Rhee, Yongin-si (KR); Ji-Hye Lee, Hwaseong-si (KR); Taeseop Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/433,199

(22) Filed: Feb. 15, 2017

(65) Prior Publication Data
US 2017/0294439 A1    Oct. 12, 2017

(30) Foreign Application Priority Data

Apr. 6, 2016    (KR) .......................... 10-2016-0042507

(51) Int. Cl.
*H01L 21/70* (2006.01)
*H01L 27/108* (2006.01)
(Continued)

(52) U.S. Cl.
CPC .. *H01L 27/10805* (2013.01); *H01L 27/10814* (2013.01); *H01L 27/10823* (2013.01);
(Continued)

(58) Field of Classification Search
CPC .................. H01L 27/10805; H01L 27/10882
See application file for complete search history.

(56) References Cited

U.S. PATENT DOCUMENTS

| 8,835,252 B2 | 9/2014 | Moon et al. |
| 8,906,763 B2 | 12/2014 | Park et al. |
| (Continued) | | |

FOREIGN PATENT DOCUMENTS

| KR | 1020090112038 | 10/2009 |
| KR | 1020110086357 | 7/2011 |
| (Continued) | | |

*Primary Examiner* — Ismail A Muse
(74) *Attorney, Agent, or Firm* — Myers Bigel, P.A.

(57) ABSTRACT

Semiconductor devices and method of manufacturing the same are provided. The devices may include a substrate including a first impurity region and second impurity regions spaced apart from the first impurity region and a conductive line. The conductive line may extend in a first direction and may be electrically connected to the first impurity region. The devices may also include first conductive contacts on a side of the conductive line and arranged in the first direction and first insulation patterns on the side of the conductive line and arranged in the first direction. The first conductive contacts may be electrically connected to the second impurity regions. The first conductive contacts and the first insulation patterns may be alternately disposed along the first direction. Top surfaces of the first insulation patterns may be lower than a top surface of the conductive line relative to an upper surface of the substrate.

10 Claims, 23 Drawing Sheets

(51) Int. Cl.
*H01L 27/22* (2006.01)
*H01L 27/24* (2006.01)

(52) U.S. Cl.
CPC .. *H01L 27/10852* (2013.01); *H01L 27/10876* (2013.01); *H01L 27/10882* (2013.01); *H01L 27/10885* (2013.01); *H01L 27/228* (2013.01); *H01L 27/2436* (2013.01)

(56) References Cited

U.S. PATENT DOCUMENTS

| | | | |
|---|---|---|---|
| 9,048,109 B2 | 6/2015 | Chung | |
| 9,099,343 B2 | 8/2015 | Kim et al. | |
| 9,142,536 B2 | 9/2015 | Kim | |
| 2004/0188745 A1* | 9/2004 | Kim | H01L 22/32 257/306 |
| 2008/0299722 A1 | 12/2008 | Hartwich et al. | |
| 2009/0095996 A1* | 4/2009 | Chung | H01L 27/0207 257/296 |
| 2010/0181672 A1* | 7/2010 | Hwang | H01L 27/10885 257/754 |
| 2011/0217820 A1* | 9/2011 | Cho | H01L 21/768 438/270 |
| 2014/0112050 A1 | 4/2014 | Park | |
| 2014/0203357 A1 | 7/2014 | Kim et al. | |
| 2015/0162335 A1 | 6/2015 | Kim et al. | |
| 2015/0221548 A1* | 8/2015 | Yu | H01L 21/76879 438/666 |
| 2015/0340367 A1* | 11/2015 | Manabe | H01L 21/743 257/334 |

FOREIGN PATENT DOCUMENTS

| | | |
|---|---|---|
| KR | 1020110101678 | 9/2011 |
| KR | 1020120003741 | 1/2012 |
| KR | 1020120076913 | 7/2012 |
| KR | 1020120103246 | 9/2012 |
| KR | 1020140091845 | 7/2014 |
| KR | 1020150074629 | 7/2015 |

\* cited by examiner

SEMICONDUCTOR DEVICES INCLUDING CONDUCTIVE CONTACTS AND INSULATION PATTERNS ARRANGED IN AN ALTERNATING SEQUENCE AND METHODS OF FABRICATING THE SAME

CROSS-REFERENCE TO RELATED APPLICATION

This U.S. nonprovisional patent application claims priority under 35 U.S.C. § 119 to Korean Patent Application 10-2016-0042507 filed on Apr. 6, 2016, the disclosure of which is hereby incorporated by reference in its entirety.

BACKGROUND

The present inventive concepts generally relate to the field of electronics and, more particularly, a semiconductor device and a method of fabricating the same.

Semiconductor devices are widely used in the electronics industry because they may provide a small size, multi-function and/or low fabrication cost. However, as semiconductor devices are highly integrated, there may be problems associated with fabrication processes. For example, fabricating highly integrated semiconductor devices may decrease line widths and/or spaces of patterns in the semiconductor devices. Accordingly, uniformities of deposition and/or etch processes for thin films may become poor and reliability of the semiconductor devices may be deteriorated.

SUMMARY

Embodiments of the present inventive concepts provide a semiconductor device and a method of fabricating the same having improved electrical characteristics.

Embodiments of the present inventive concepts provide a semiconductor device and a method of fabricating the same having superior reliability.

According to some embodiments of the present inventive concepts, semiconductor devices may include a substrate including a first impurity injection region and second impurity injection regions spaced apart from the first impurity injection region and a conductive line extending in a first direction on the substrate and electrically connected to the first impurity injection region. The semiconductor device may also include a plurality of first conductive contacts provided on a side of the conductive line and arranged in the first direction and a plurality of first insulation patterns provided on the side of the conductive line and arranged in the first direction. Each of the first conductive contacts may be electrically connected to a corresponding one of the second impurity injection regions. The first conductive contacts and the first insulation patterns may be alternately disposed along the first direction. Top surfaces of the first insulation patterns may be lower than a top surface of the conductive line relative to an upper surface of the substrate.

According to some embodiments of the present inventive concepts, method of fabricating a semiconductor device may include forming a device isolation layer to define an active pattern in a substrate, forming a first impurity injection region in the active pattern, forming on the substrate, a plurality of mask patterns that define an opening through which the first impurity injection region is exposed and forming a plurality of insulation patterns interposed between the plurality of mask patterns. The plurality of mask patterns may include a first pair of mask patterns spaced apart from each other with the first impurity injection region therebetween in a first direction, and a second pair of mask patterns spaced apart from each other with the first impurity injection region therebetween in a second direction crossing the first direction, in a plan view. Each of the plurality of insulation patterns may be positioned between one of the first pair of mask patterns and one of the second pair of mask patterns.

According to some embodiments of the present inventive concepts, integrated circuit devices may include a plurality of active patterns on a substrate, an interlayer dielectric layer on the plurality of the active patterns, first and second bit lines in the interlayer dielectric layer, a plurality of conductive contacts that are between the first and second bit lines in a plan view and in the interlayer dielectric layer, and a plurality of insulation patterns that are between the first and second bit lines in the plan view and in the interlayer dielectric layer. The first and second bit lines may extend in a first direction. The plurality of conductive contacts may be arranged along the first direction and may be electrically connected to the plurality of active patterns, respectively. The plurality of insulation patterns and the plurality of conductive contacts may be arranged in an alternating sequence along the first direction.

BRIEF DESCRIPTION OF THE DRAWINGS

FIGS. 2A to 7A are plan views illustrating a method of fabricating a semiconductor device according to some embodiments of the present inventive concepts.

FIGS. 2B to 7B are cross-sectional views taken along the lines A-A' and B-B' of FIG. 2A to 7A, respectively.

FIGS. 2C to 7C are cross-sectional views taken along the lines C-C' and D-D' of FIGS. 2A to 7A, respectively.

DETAILED DESCRIPTION

As used herein the term "and/or" includes any and all combinations of one or more of the associated listed items.

Figure 1A:
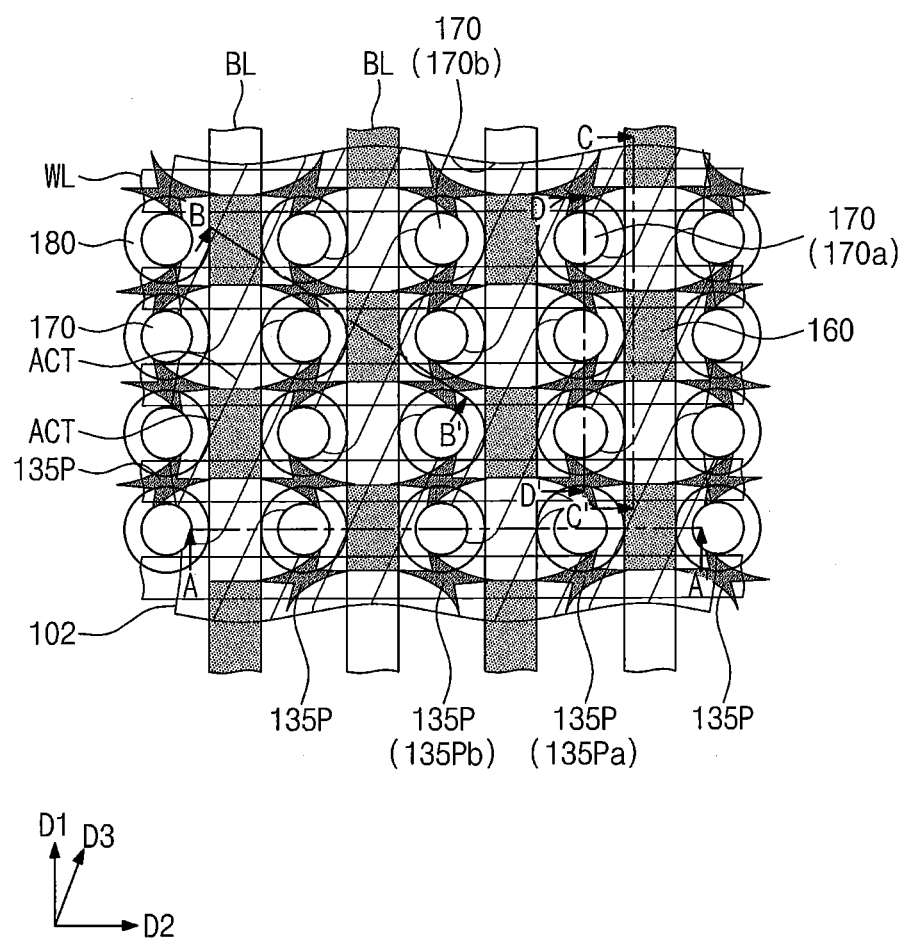
FIG. 1A is a plan view illustrating a semiconductor device according to some embodiments of the present inventive concepts.
Figure 1B:
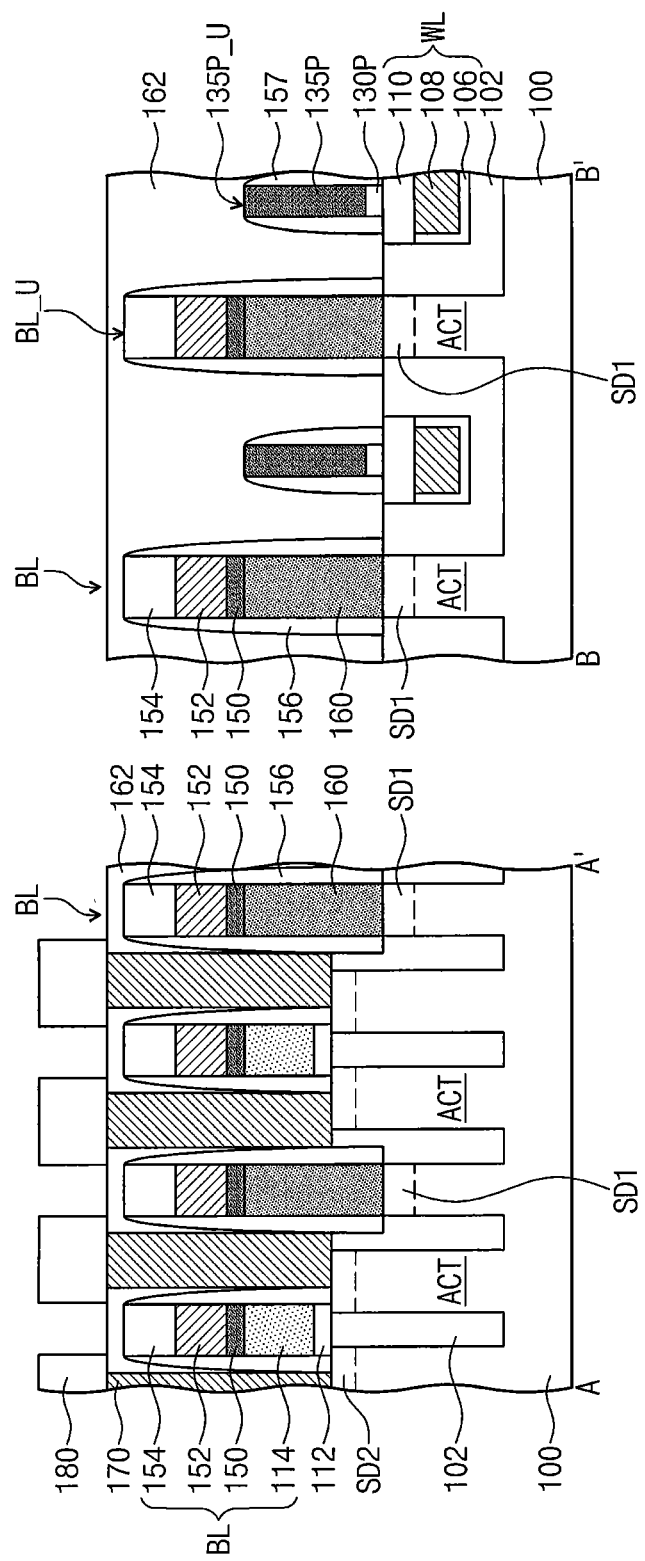
FIG. 1B is a cross-sectional view taken along the lines A-A' and B-B' of FIG. 1A.
Figure 1C:
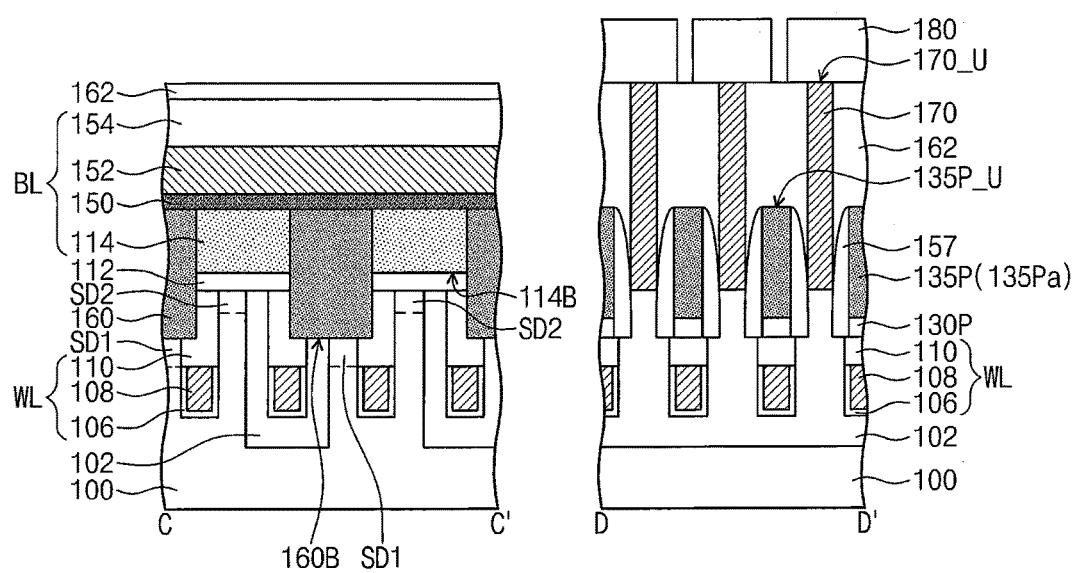
FIG. 1C is a cross-sectional view taken along the lines C-C' and D-D' of FIG. 1A.

FIG. 1A is a plan view illustrating a semiconductor device according to some embodiments of the present inventive concepts. FIG. 1B is a cross-sectional view taken along the lines A-A' and B-B' of FIG. 1A. FIG. 1C is a cross-sectional view taken along the lines C-C' and D-D' of FIG. 1A.

Referring to FIGS. 1A to 1C, a device isolation layer 102 may be provided to define active patterns ACT in the substrate 100. The active patterns ACT may protrude from the substrate 100. The substrate 100 may be a semiconductor substrate, for example, a silicon substrate, a germanium substrate, a silicon-germanium substrate. The device isolation layer 102 may include, for example, a silicon oxide layer, a silicon nitride layer, and/or a silicon oxynitride layer. In a plan view, each of the active patterns ACT may have a bar shape whose long axis is positioned along a third direction D3 that traverses both a first direction D1 and a second direction D2 as illustrated in FIG. 1A. The second direction D2 may traverse (e.g., cross) the first direction D1. For example, the first and second directions D1 and D2 may be perpendicular to each other.

A plurality of word lines WL may be provided in the substrate 100 and run across the active patterns ACT. The word lines WL may extend along the second direction D2 and arranged along the first direction D1. The word lines WL may extend longitudinally in the second direction D2 as illustrated in FIG. 1A. Each of the word lines WL may include a gate electrode 108 in the substrate 100, a gate dielectric pattern 106 interposed between the gate electrode 108 and the active patterns ACT and between the gate electrode 108 and the device isolation layer 102, and a gate capping pattern 110 on a top surface (e.g., uppermost surface) of the gate electrode 108. The gate capping pattern 110 may include a top surface substantially coplanar with a top surface of the substrate 100. In some embodiments, the gate capping pattern 110 may include a bottom surface in contact with a top surface of the gate dielectric pattern 106 and may include opposing sidewalls in contact with the active patterns ACT and/or the device isolation layer 102. In some embodiments, the gate dielectric pattern 106 may extend between the gate capping pattern 110 and the active patterns ACT and/or between the gate capping pattern 110 and the device isolation layer 102.

The gate electrode 108 may include a conductive material. For example, the conductive material may be one of doped semiconductor (e.g., doped silicon, doped germanium, etc.), conductive metal nitride (e.g., titanium nitride, tantalum nitride, etc.), metal (tungsten, titanium, tantalum, etc.), and metal-semiconductor compound (e.g., tungsten silicide, cobalt silicide, titanium silicide, etc.). The gate dielectric pattern 106 may include, for example, a silicon oxide layer, a silicon nitride layer, and/or a silicon oxynitride layer. The gate capping pattern 110 may include, for example, a silicon oxide layer, a silicon nitride layer, and/or a silicon oxynitride layer.

Each of the active patterns ACT may include therein a first impurity injection region SD1 and second impurity injection regions SD2 that are spaced apart from each other with the first impurity injection region SD1 therebetween. The first impurity injection region SD1 may be provided in the active pattern ACT between a pair of the word lines WL that run across the active pattern ACT. It will be understood that the pair of the word lines WL are immediately adjacent to each other since there is no word line WL between the pair of the word lines WL. The second impurity injection regions SD2 may be provided in the active pattern ACT and spaced apart from each other with the pair of the word lines WL therebetween. For example, the first impurity injection region SD1 may be provided in the active pattern ACT on a first side of a word line WL, and the second impurity injection region SD2 may be provided in the active pattern ACT on a second side of the word line WL, which is opposite the first side of the word line WL. The first impurity injection region SD1 may extend into the substrate 100 to a depth greater than those of the second impurity injection regions SD2. The first impurity injection region SD1 may include impurities whose conductivity type is the same as those of the second impurity injection regions SD2.

The substrate 100 may include thereon a plurality of conductive lines BL that extend in the first direction D1 and are spaced apart from each other in the second direction D2. The conductive lines BL may be, for example, bit lines. Each of the conductive lines BL may include first conductive patterns 114 that are spaced apart from each other in the first direction D1, a second conductive pattern 152 that is provided on top surfaces of the first conductive patterns 114 and extends in the first direction D1, and a barrier pattern 150 between the second conductive pattern 152 and the first conductive patterns 114. Each of the conductive lines BL may be electrically connected to the first impurity injection region SD1 through an interconnect contact 160. The interconnect contact 160 may be interposed between the first conductive patterns 114 such that the first conductive patterns 114 may be connected to each other through the interconnect contact 160. The second conductive pattern 152 may extend from a top surface of the interconnect contact 160 to the top surfaces of the first conductive patterns 114, and the barrier pattern 150 may extend between the second conductive pattern 152 and the interconnect contact 160. In some embodiments, the first conductive patterns 114 and the interconnect contact 160 may include the same material and may be in contact with each other to constitute a single unitary body.

The interconnect contact 160 may extend through at least a portion of the substrate 100 and may contact (e.g., directly contact) the first impurity injection region SD1. The interconnect contact 160 may include a bottom surface 160B that is lower than the top surface of the substrate 100 as illustrated in FIG. 1C. Each of the first conductive patterns 114 may include a bottom surface 114B that is higher than the top surface of the substrate 100. That is, the interconnect contact 160 may include the bottom surface 160B that is lower than the bottom surface 114B of each of the first conductive patterns 114 relative to a bottom surface of the substrate 100. In a plan, the interconnect contact 160 may include opposing sidewalls aligned with opposing sidewalls of each of the conductive lines BL. In some embodiments, the interconnect contact 160 and each of the conductive lines BL may have a width in the second direction D2, and the width of each of the conductive lines BL may be the substantially same as the width of the interconnect contact 160.

A plurality of lower insulation patterns 112 may be provided between the substrate 100 and each of the conductive lines BL. The lower insulation patterns 112 may be arranged along the first direction D1 and provided locally below each of the conductive lines BL. Each of the lower insulation patterns 112 may be provided between the substrate 100 and each of the first conductive patterns 114. The interconnect contact 160 may extend between the lower insulation patterns 112 and contact with the first impurity injection region SD1. Each of the conductive lines BL may be spaced apart from the substrate 100 by the lower insulation patterns 112 and electrically connected to the first impurity injection region SD1 through the interconnect contact 160.

Each of the conductive lines BL may further include a capping pattern 154 provided on a top surface of the second conductive pattern 152. The capping pattern 154 may extend in the first direction D1 along the top surface of the second conductive pattern 152.

The first conductive patterns 114 may include one of, for example, doped semiconductor (e.g., doped silicon, doped germanium, etc.), conductive metal nitride (e.g., titanium nitride, tantalum nitride, etc.), metal (tungsten, titanium, tantalum, etc.), and metal-semiconductor compound (e.g., tungsten silicide, cobalt silicide, titanium silicide, etc.). Each of the second conductive pattern 152 and the barrier pattern 150 may include, for example, conductive metal nitride (e.g., titanium nitride, tantalum nitride, etc.), metal (tungsten, titanium, tantalum, etc.), and metal-semiconductor compound (e.g., tungsten silicide, cobalt silicide, titanium silicide, etc.). The interconnect contact 160 may include one of, for example, doped semiconductor (e.g., doped silicon, doped germanium, etc.), conductive metal nitride (e.g., titanium nitride, tantalum nitride, etc.), metal (tungsten, titanium, tantalum, etc.), and metal-semiconductor compound (e.g., tungsten silicide, cobalt silicide, titanium silicide, etc.). In some embodiments, the interconnect contact 160 may include the same material as the first conductive patterns 114. Each of eh lower insulation patterns 112 and the capping pattern 154 may include, for example, a silicon nitride layer, a silicon oxide layer, and/or a silicon oxynitride layer.

A plurality of first spacers 156 may be provided on the opposing sidewalls of each of the conductive lines BL. The first spacers 156 may extend toward opposing sidewalls of the interconnect contact 160 from the opposing sidewalls of each of the conductive lines BL. Also, the first spacers 156 may extend toward opposing sidewalls of each of the lower insulation patterns 112 from the opposing sidewalls of each of the conductive lines BL. The first spacers 156 may include, for example, a silicon nitride layer, a silicon oxide layer, and/or a silicon oxynitride layer.

A plurality of insulation patterns 135P may be provided on opposing sides of each of the conductive lines BL. The insulation patterns 135P may include first insulation patterns 135Pa that are provided on a first side of each of the conductive lines BL and arranged in the first direction D1 and second insulation patterns 135Pb that are provided on a second side of each of the conductive lines BL, which is opposite the first side of the each of the conductive lines BL, and arranged in the first direction D1 as illustrated in FIG. 1A. The first insulation patterns 135Pa may be spaced apart from the second insulation patterns 135Pb with each of the conductive lines BL therebetween. In some embodiments, each of the first insulation patterns 135Pa may be aligned with each of the second insulation patterns 135Pb in the second direction D2. Each of the insulation patterns 135P may have a top surface 135P_U that is lower than a top surface BL_U of each of the conductive lines BL relative to the top surface of the substrate 100. In some embodiments, each of the insulation patterns 135P may overlap one of the word lines WL as illustrated in FIGS. 1A and 1C.

A plurality of etch stop patterns 130P may be provided between the insulation patterns 135P and the substrate 100. The etch stop patterns 130P may be respectively disposed below the insulation patterns 135P. The insulation patterns 135P and the etch stop patterns 130P may include an insulating material (e.g., electrically insulating material). The insulation patterns 135P and the etch stop patterns 130P may include at least one of, for example, silicon nitride, silicon oxide, and silicon oxynitride. The etch stop patterns 130P may include a material having an etch selectivity with respect to the insulation patterns 135P.

A plurality of second spacers 157 may be provided on sidewalls of each of the insulation patterns 135P. The second spacers 157 may extend onto sidewalls of each of the etch stop patterns 130P from the sidewalls of each of the insulation patterns 135P. The second spacers 157 may include the same material as the first spacers 156.

An interlayer dielectric layer 162 may be provided on the substrate 100 and cover the conductive lines BL and the insulation patterns 135P. Each of the conductive lines BL and each of the insulation patterns 135P may be provided in the interlayer dielectric layer 162 and may extend through at least a portion of the interlayer dielectric layer 162. The interlayer dielectric layer 162 may cover the interconnect contact 160, the lower insulation pattern 112, the first spacers 156, the etch stop patterns 130P, and the second spacers 157. The interlayer dielectric layer 162 may include, for example, a silicon oxide layer.

A plurality of conductive contacts 170 may be provided on the substrate 100 and may extend through the interlayer dielectric layer 162 such that the second impurity injection regions SD2 may be electrically connected to the conductive contacts 170, respectively. Each of the conductive contacts 170 may be electrically connected to its corresponding second impurity injection region SD2. The conductive contacts 170 may include first conductive contacts 170a that are provided on the first side of each of the conductive lines BL and arranged in the first direction D1 and second conductive contacts 170b that are provided on the second side of each of the conductive lines BL, which is opposite the first side of each of the conductive lines BL, and arranged in the first direction D1. The first conductive contacts 170a may be spaced apart from the second conductive contacts 170b with each of the conductive lines BL therebetween. In some embodiments, each of the first conductive contacts 170a may be aligned with each of the second conductive contacts 170b in the second direction D2, as illustrated in FIG. 1A.

The first conductive contacts 170a and the first insulation patterns 135Pa may be alternately disposed along the first direction D1, and the second conductive contacts 170b and the second insulation patterns 135Pb may be alternately disposed along the first direction D1. As illustrated in FIG. 1A, the first conductive contacts 170a and the first insulation patterns 135Pa may be between two immediately adjacent conductive lines BL. It will be understood that there is no conductive line BL between the two immediately adjacent conductive lines BL. For example, a single insulation pattern 135P may be provided between a pair of the conductive contacts 170 immediately adjacent to each other in the first direction D1. It will be understood that there is no conductive contact 170 between the pair of the conductive contacts 170 that are immediately adjacent to each other. Each of the conductive contacts 170 may have a top surface 170_U that is higher than the top surface 135P_U of each of the insulation patterns 135P relative to the top surface of the substrate, as illustrated in FIG. 1C.

In some embodiments, as the insulation pattern 135P is provided between the pair of the conductive contacts 170 immediately adjacent to each other in the first direction D1, it may be possible to prevent an electrical short between the pair of the conductive contacts 170.

The interlayer dielectric layer 162 may include thereon a plurality of data storage elements 180 respectively connected to the conductive contacts 170. Each of the data storage elements 180 may be electrically connected to its corresponding second impurity injection region SD2 through its corresponding conductive contact 170. Examples of the data storage elements 180 will be discussed in detail with reference to FIGS. 1D and 1E.

Figure 1D:
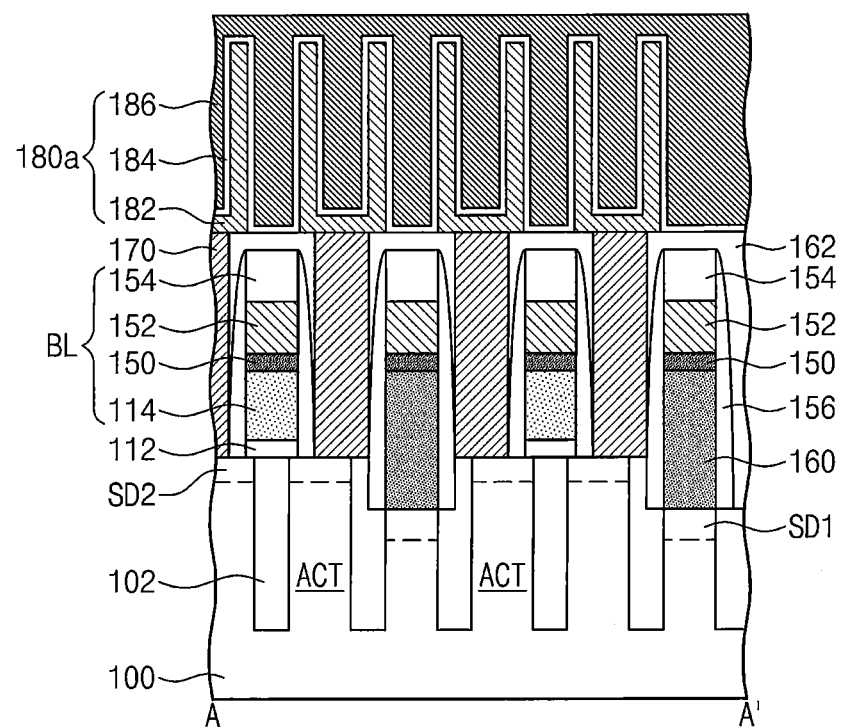
FIG. 1D is a cross-sectional view taken along the line A-A' of FIG. 1A illustrating an example of a data storage element included in a semiconductor device according to some embodiments of the present inventive concepts.

FIG. 1D is a cross-sectional view taken along the line A-A' of FIG. 1A illustrating an example of a data storage element included in a semiconductor device according to some embodiments of the present inventive concepts.

Referring to FIG. 1D, in some embodiments, each of data storage elements 180a may be a capacitor. For example, the data storage elements 180a may include bottom electrodes 182 respectively connected to the conductive contacts 170, a top electrode 186 covering the bottom electrodes 182, and a dielectric layer 184 between the bottom electrodes 182 and the top electrode 186. The top electrode 186 may be a common electrode that commonly covers the bottom electrodes 182. In some embodiments, each of the bottom electrodes 182 may have a hollow cylindrical shape, and the top electrode 186 may extend into a hollow space defined by an inner surface of each of the bottom electrodes 182. The dielectric layer 184 may conformally cover a top surface and sidewalls of each of the bottom electrodes 182 and may extend between the top electrode 186 and the interlayer dielectric layer 162.

The bottom electrodes 182 and the top electrode 186 may include impurity doped silicon, metal, or metal compound. The dielectric layer 184 may be a single layer or multiple layers including one selected from the group consisting of metal oxide such as HfO2, ZrO2, Al2O3, La2O3, Ta2O3 and TiO2, perovskite structure dielectric such as SrTiO3(STO), (Ba,Sr)TiO3(BST), BaTiO3, PZT and PLZT, and a combination thereof.

Figure 1E:
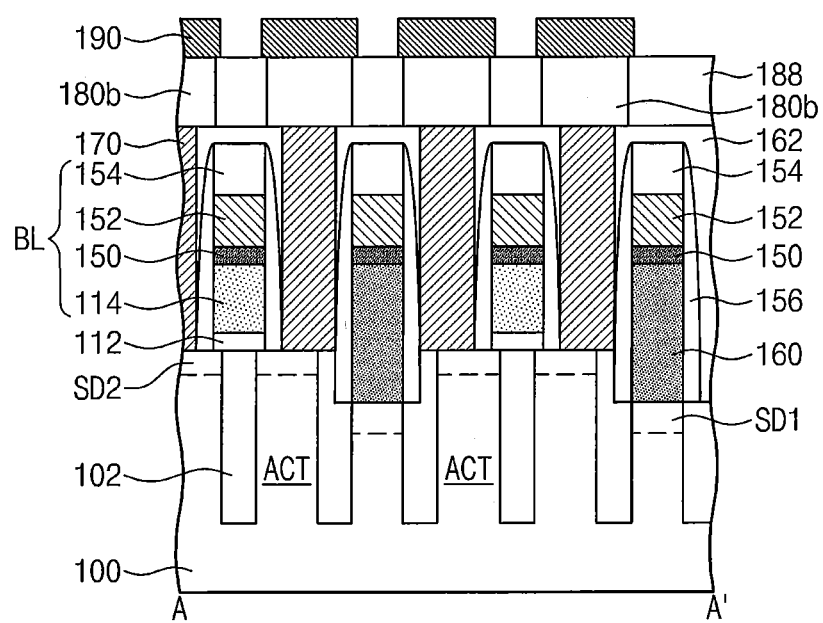
FIG. 1E is a cross-sectional view taken along the line A-A' of FIG. 1A illustrating an example of a data storage element included in a semiconductor device according to some embodiments of the present inventive concepts.

FIG. 1E is a cross-sectional view taken along the line A-A' of FIG. 1A illustrating an example of a data storage element included in a semiconductor device according to some embodiments of the present inventive concepts.

Referring to FIG. 1E, in some embodiments, each of data storage elements 180b may be a variable resistor. The variable resistor may be reversibly changed between a plurality of states having different resistances from each other in response to a program operation.

In some embodiments, the variable resistor may be a magnetic tunnel junction pattern which uses magnetization directions thereof. The magnetic tunnel junction pattern may include a reference magnetic pattern having a unidirectionally fixed magnetization direction, a free magnetic pattern having a variable magnetization direction that can be changed parallel or antiparallel to the magnetization direction of the reference magnetic pattern, and a tunnel barrier between the reference and free magnetic patterns. The magnetization directions of the reference and free magnetic patterns may be vertical or parallel to a surface of the free magnetic pattern adjacent to the tunnel barrier.

In some embodiments, the variable resistor may include a phase change material. The phase change material may be in an amorphous state or in a crystalline state according to temperature and/or supply time of heat provided in response to a program operation. The phase change material may have resistivity whose value is greater in the amorphous state than in the crystalline state. For example, the phase change material may be a compound including at least one of chalcogenide elements (e.g., Te and Se).

In some embodiments, the variable resistor may include transition metal oxide. An electrical path may be created or lost in the transition metal oxide in response to a program operation. The transition metal oxide may have resistance whose value is low when the electrical path is created and whose value is high when the electrical path is lost.

The interlayer dielectric layer 162 may include thereon an upper interlayer dielectric layer 188 that covers the data storage elements 180b, and the upper interlayer dielectric layer 188 may include thereon a plurality of upper lines 190 that are respectively connected to the data storage elements 180b. The upper lines 190 may run across the word lines WL explained with reference to FIGS. 1A to 1C. In some embodiments, the upper lines 190 may be bit lines, and the conductive lines BL explained with reference to FIGS. 1A to 1C may be source lines.

FIGS. 2A to 7A are plan views illustrating a method of fabricating a semiconductor device according to some embodiments of the present inventive concepts. FIGS. 2B to 7B are cross-sectional views taken along the lines A-A' and B-B' of FIG. 2A to 7A, respectively. FIGS. 2C to 7C are cross-sectional views taken along the lines C-C' and D-D' of FIGS. 2A to 7A, respectively.

Figure 2A:
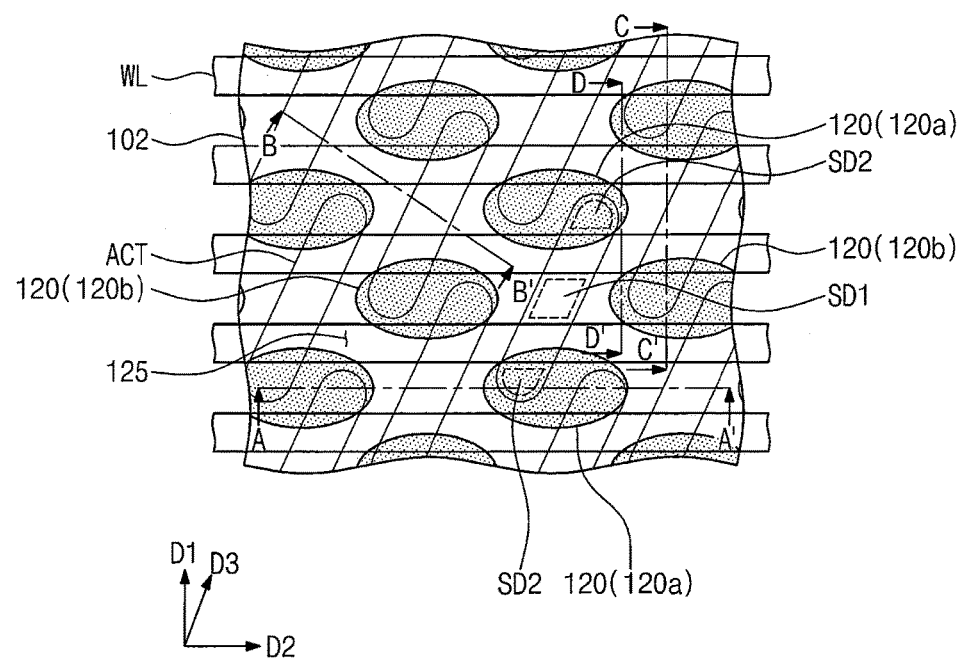
Figure 2B:
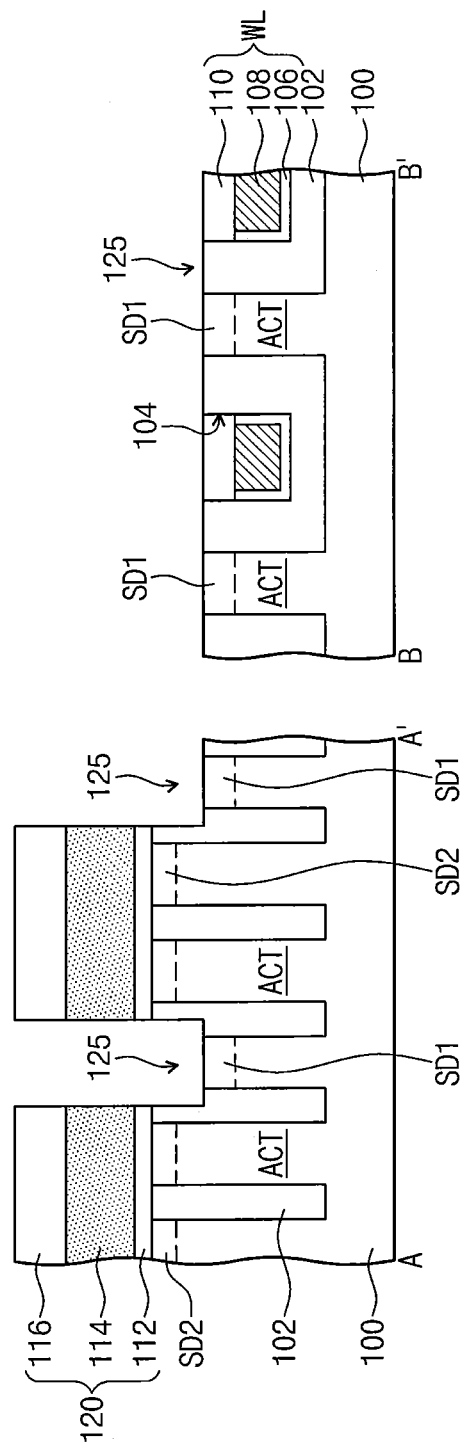
Figure 2C:
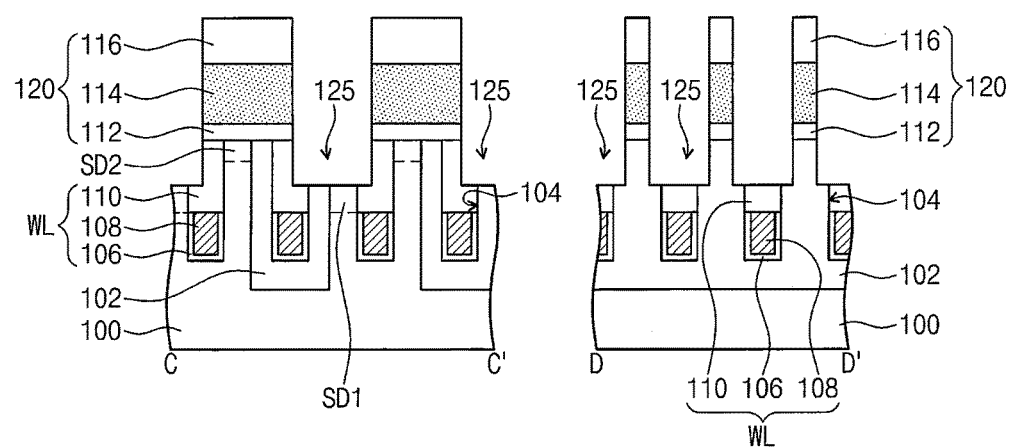

Referring to FIGS. 2A to 2C, a device isolation layer 102 may be formed to define active patterns ACT in a substrate 100. The device isolation layer 102 may be formed using a shallow trench isolation (STI) method. The device isolation layer 102 may include, for example, a silicon oxide layer, a silicon nitride layer, and/or a silicon oxynitride layer. In a plan view, each of the active patterns ACT may have a bar shape whose long axis is positioned along a third direction D3 that traverses both a first direction D1 and a second direction D2. Each of the active patterns ACT may extend longitudinally in the third direction D3. The second direction D2 may traverse the first direction D1. For example, the first and second directions D1 and D2 may be perpendicular to each other.

Second impurity injection regions SD2 may be formed in each of the active patterns ACT. The second impurity injection regions SD2 may be formed by an ion implantation process. For example, the second impurity injection regions SD2 may be a region doped with an n-type dopant.

The substrate 100 may be patterned to form grooves 104 having a line shape extending in the second direction D2. A gate dielectric layer may be formed on the substrate 100 having the grooves 104 formed therein. The gate dielectric layer may be formed using a thermal oxidation process, an atomic layer deposition process, and/or a chemical vapor deposition process. The gate dielectric layer may include, for example, a silicon oxide layer, a silicon nitride layer, and/or a silicon oxynitride layer. A gate electrode layer may be formed on the substrate 100 having the gate dielectric layer formed thereon. The gate electrode layer may be formed using a chemical vapor deposition process or the like. The gate electrode layer may be one of doped semiconductor (e.g., doped silicon, doped germanium, etc.), conductive metal nitride (e.g., titanium nitride, tantalum nitride, etc.), metal (tungsten, titanium, tantalum, etc.), and metal-semiconductor compound (e.g., tungsten silicide, cobalt silicide, titanium silicide, etc.).

The gate electrode layer may be etched to form a gate electrode 108 in each of the grooves 104. The etch process may be performed until the gate electrode layer is reduced to a predetermined thickness in the grooves 104. The etch process may remove the gate dielectric layer that is exposed by the gate electrode 108. A gate dielectric pattern 106 may then be formed between the gate electrode 108 and the active patterns ACT and/or between the gate electrode 108 and device isolation layer 102. Also, the etch process may expose a top surface of the device isolation layer 102 and a top surface of the active patterns ACT. A gate capping layer may be formed on the substrate 100 and then planarized to form a gate capping pattern 110 in each of the grooves 104. The gate capping pattern 110 may include one of a silicon nitride layer, a silicon oxide layer, and a silicon oxynitride layer. The gate electrode 108, the gate dielectric pattern 106, and the gate capping pattern 110 may constitute a word line WL.

A first impurity injection region SD1 may be formed in each of the active patterns ACT. The first impurity injection region SD1 may be formed by an ion implantation process. The first impurity injection region SD1 may be formed in the active pattern ACT between a pair of word lines WL that run across the active pattern ACT. The pair of word lines WL may share the first impurity injection region SD1. A pair of second impurity injection regions SD2 may be disposed in each of the active patterns ACT. The pair of second impurity injection regions SD2 may be spaced apart from each other with the pair of word lines WL therebetween. The first impurity injection region SD1 may be doped with n-type impurities that are the same as those of the second impurity injection regions SD2. The first impurity injection region SD1 may extend into the substrate 100 to a depth greater than those of the second impurity injection regions SD2.

A plurality of mask patterns 120 may be formed on the substrate 100. The formation of the mask patterns 120 may include sequentially forming a lower insulation layer and a first conductive layer on the substrate 100, forming a hardmask pattern 116 on the first conductive layer, and etching the first conductive layer and the lower insulation layer using the hardmask pattern 116 as an etch mask. Thus, a first conductive pattern 114 and a lower insulation pattern 112 may be formed between the hardmask pattern 116 and the substrate 100. The first conductive pattern 114 and the lower insulation pattern 112 may be locally positioned below the hardmask pattern 116. Each of the mask patterns 120 may include the hardmask pattern 116, the first conductive pattern 114, and the lower insulation pattern 112.

The mask patterns 120 may define an opening 125 that exposes a top surface of the substrate 100 between the mask patterns 120. In some embodiments, an upper portion of the substrate 100 may be recessed during the etch process for forming the first conductive pattern 114 and the lower insulation pattern 112, and thus the opening 125 may have a bottom surface positioned at a height lower than that of the top surface of the substrate 100.

In a plan view, the mask patterns 120 may surround and expose the first impurity injection region SD1 of each of the active patterns ACT. In other words, the opening 125 defined by the mask patterns 120 may expose the first impurity injection region SD1 of each of the active patterns ACT. In the plan view, the second impurity injection regions SD2 of each of the active patterns ACT may respectively overlap corresponding mask patterns 120.

In some embodiments, the mask patterns 120 may include a pair of first mask patterns 120a that are immediately adjacent to each other in the first direction D1 with the first impurity injection region SD1 therebetween and a pair of second mask patterns 120b that are immediately adjacent to each other in the second direction D2 with the first impurity injection region SD1 therebetween, as illustrated in FIG. 2A. It will be understood that there is no first mask pattern 120a between the pair of first mask patterns 120a since the pair of first mask patterns 120a are immediately adjacent to each other. It will be also understood that there is no second mask pattern 120b between the pair of second mask patterns 120b since the pair of second mask patterns 120b are immediately adjacent to each other. In the plan view, the first impurity injection region SD1 of each of the active patterns ACT may be surrounded by the pair of first mask patterns 120a and the pair of second mask patterns 120b. The pair of first mask patterns 120a and the pair of second mask patterns 120b may expose the first impurity injection region SD1 of each of the active patterns ACT.

Figure 3A:
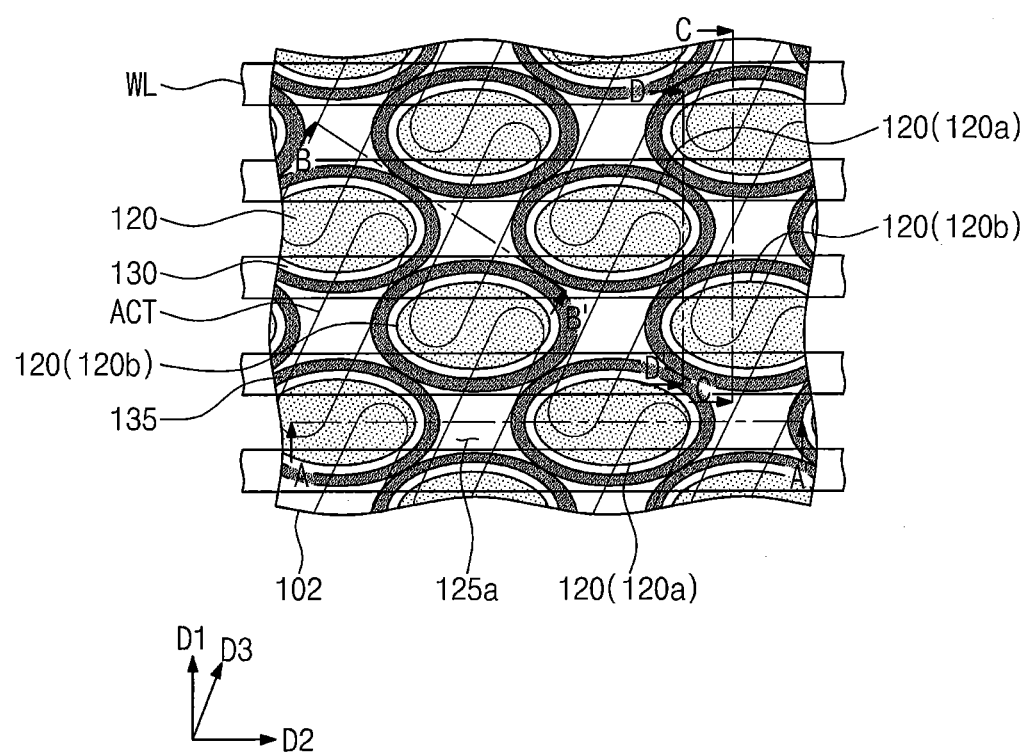
Figure 3B:
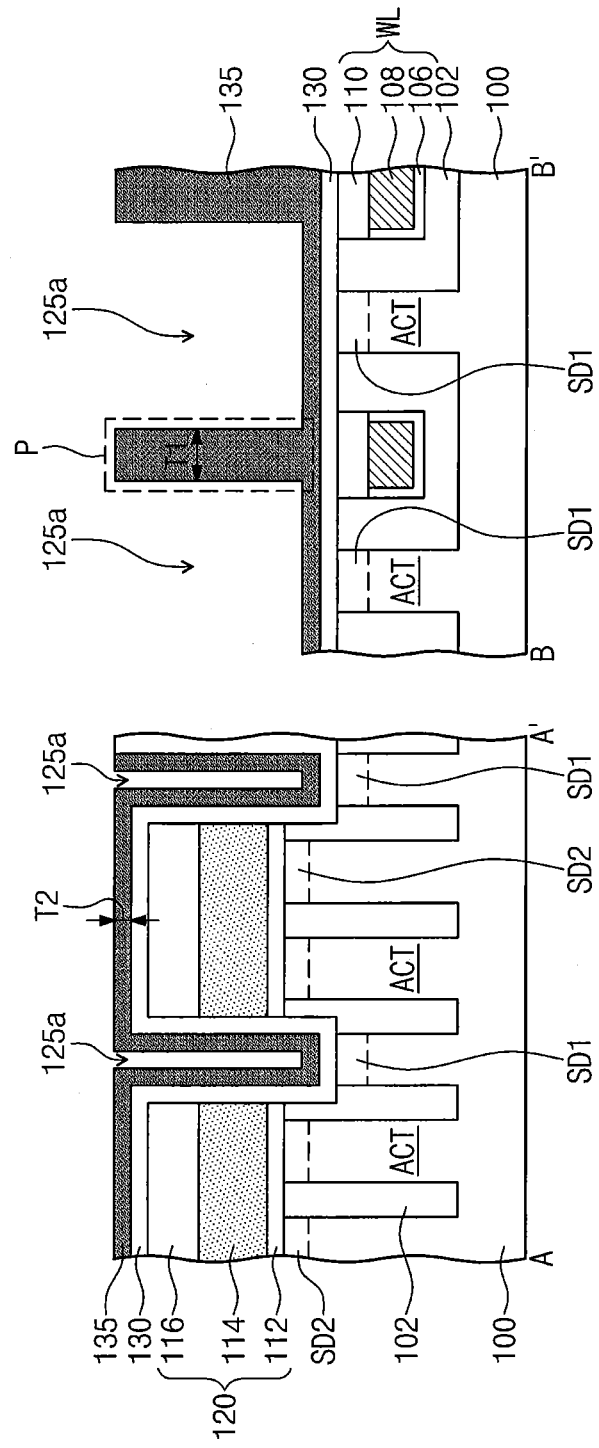
Figure 3C:
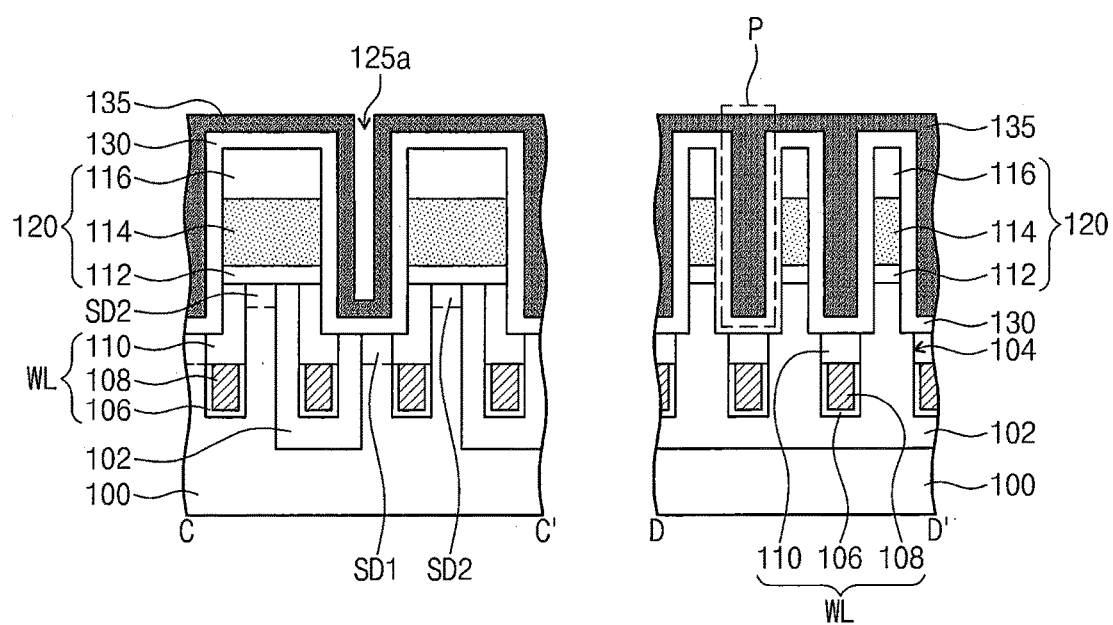

Referring to FIGS. 3A to 3C, an etch stop layer 130 and an insulation layer 135 may be sequentially formed on the substrate 100. The etch stop layer 130 may cover top surfaces and sidewalls of the mask patterns 120 and may extend onto the substrate 100 and between the mask patterns 120. The etch stop layer 130 may be formed by performing, for example, an atomic layer deposition process. The etch stop layer 130 may include at least one of, for example, silicon nitride, silicon oxide, and silicon oxynitride.

The insulation layer 135 may be formed on the substrate 100 including the etch stop layer 130 formed thereon. The insulation layer 135 may cover the top surfaces and the sidewalls of the mask patterns 120 and may extend onto the substrate 100 and between the mask patterns 120. In a plan view, one insulation layer 135 surrounding a sidewall of each of the mask patterns 120 may be in contact with a neighboring insulation layer 135 surrounding a sidewall of a neighboring mask pattern 120 immediately adjacent to the one insulation layer 135 as illustrated in FIG. 3A. Therefore, the insulation layer 135 may include a protrusion P that protrudes in a vertical direction that is perpendicular to the top surface of the substrate 100 between a pair of the mask patterns 120 that are immediately adjacent to each other. The protrusion P may have a thickness T1 in a direction parallel to the top surface of the substrate 100, and the thickness T1 of the protrusion P may be greater than a deposition thickness T2 of the insulation layer 135. The protrusion P may be provided in plural, and the plurality of protrusions P may surround the first impurity injection region SD1 of each of the active patterns ACT in a plan view. The insulation layer 135 may divide the opening 125 into a plurality of sub-openings 125a. In the plan view, each of the plurality of sub-openings 125a may overlap the first impurity injection region SD1 of each of the active patterns ACT.

In some embodiments, in the plan view, the insulation layer 135 surrounding a sidewall of each of the pair of first mask patterns 120a may be in contact with a neighboring insulation layer 135 surrounding a sidewall of each of the pair of second mask patterns 120b. Each of the protrusions P may be provided between one of the pair of first mask patterns 120a and one of the pair of second mask patterns 120b. The protrusions P may separate each of the plurality of sub-openings 125a from an adjacent one of the plurality of sub-openings 125a.

The insulation layer 135 may be formed by performing, for example, a chemical vapor deposition process or the like. The insulation layer 135 may include at least one of, for example, silicon nitride, silicon oxide, and silicon oxynitride, and the insulation layer 135 may have an etch selectivity with respect to the etch stop layer 130.

Figure 4A:
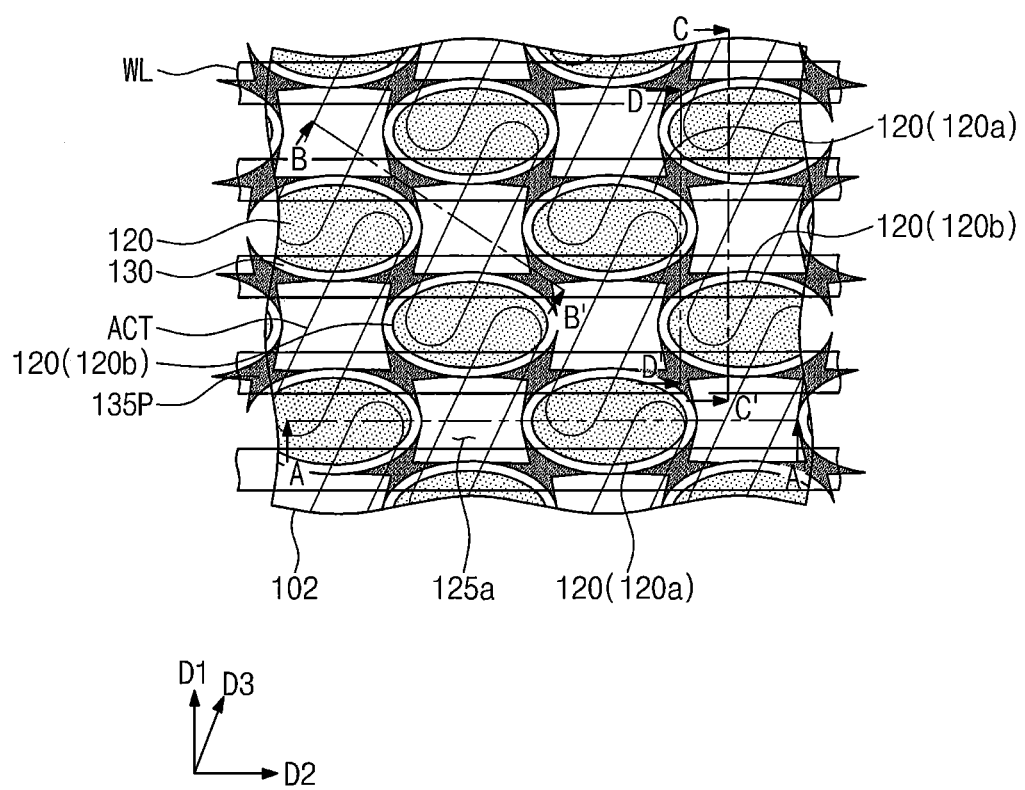
Figure 4B:
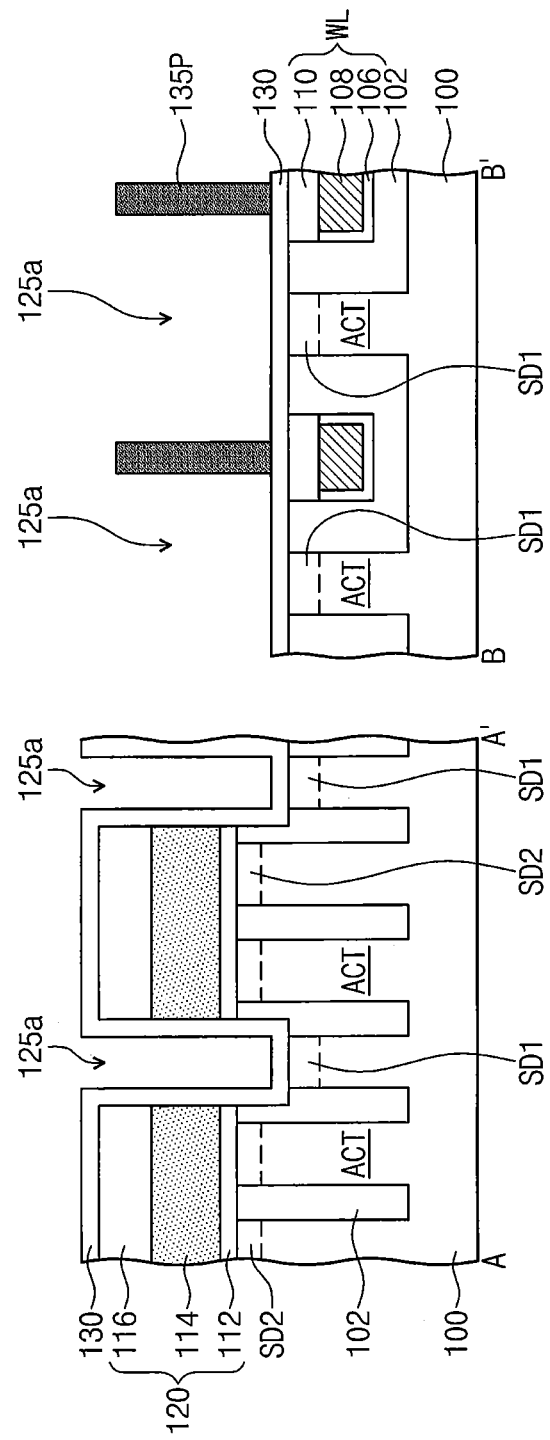
Figure 4C:
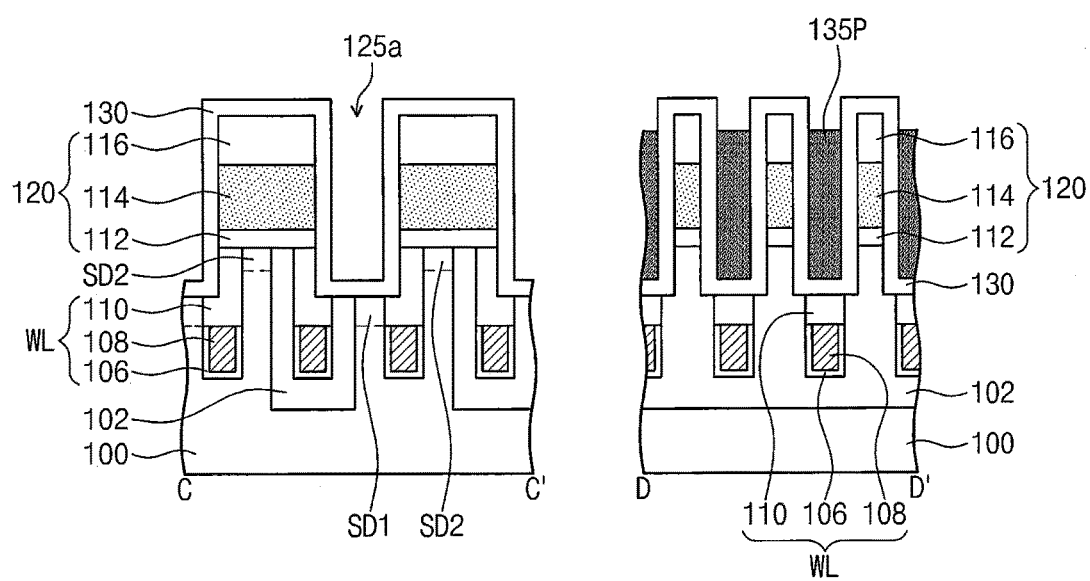

Referring to FIGS. 4A to 4C, the insulation layer 135 may be etched to form an insulation pattern 135P on the substrate 100. The etching of the insulation layer 135 may include performing, for example, a wet etch process using, for example, hydrofluoric acid and/or phosphoric acid. As the insulation layer 135 includes a material having an etch selectivity with respect to the etch stop layer 130, the etch stop layer 130 may not be removed during the etch process. Furthermore, the thickness T1 of the protrusion P may be greater than the deposition thickness T2 of the insulation layer 135, and thus at least a portion of the protrusion P may remain on the substrate 100 during the etch process. The at least a portion of the protrusion P remaining on the substrate 100 may be defined as the insulation pattern 135P. The insulation pattern 135P may be provided in plural, and the plurality of insulation patterns 135P may surround the first impurity injection region SD1 of each of the active patterns ACT in a plan view. Each of the plurality of insulation patterns 135P may be interposed between a pair of the mask patterns 120 immediately adjacent to each other. In some embodiments, each of the insulation patterns 135P may be provided between one of the pair of first mask patterns 120a and one of the pair of second mask patterns 120b. The insulation patterns 135p may separate each of the plurality of sub-openings 125a from an adjacent one of the plurality of sub-openings 125a.

Figure 5A:
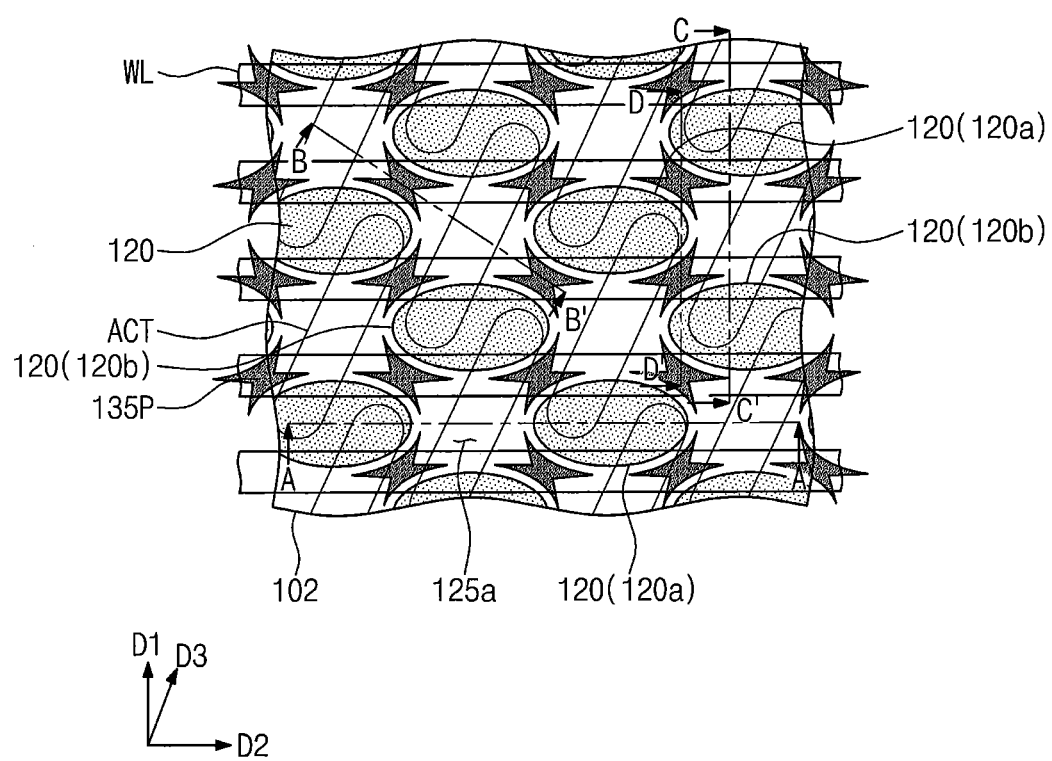
Figure 5B:
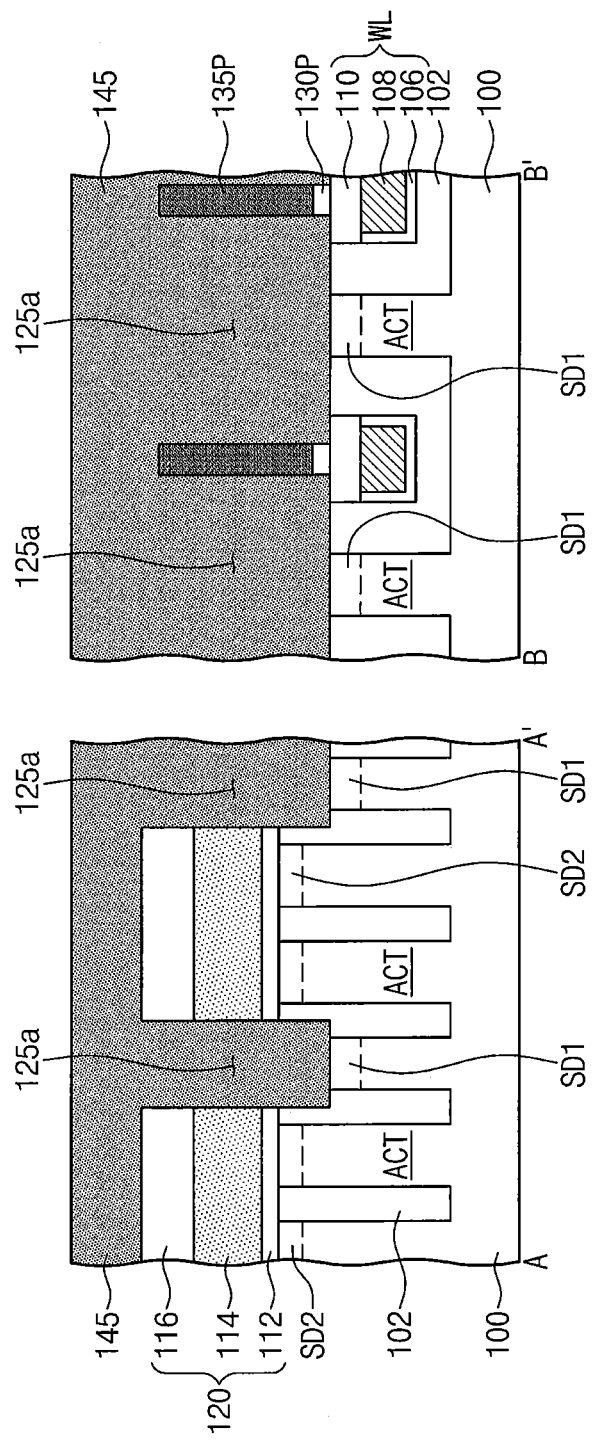
Figure 5C:
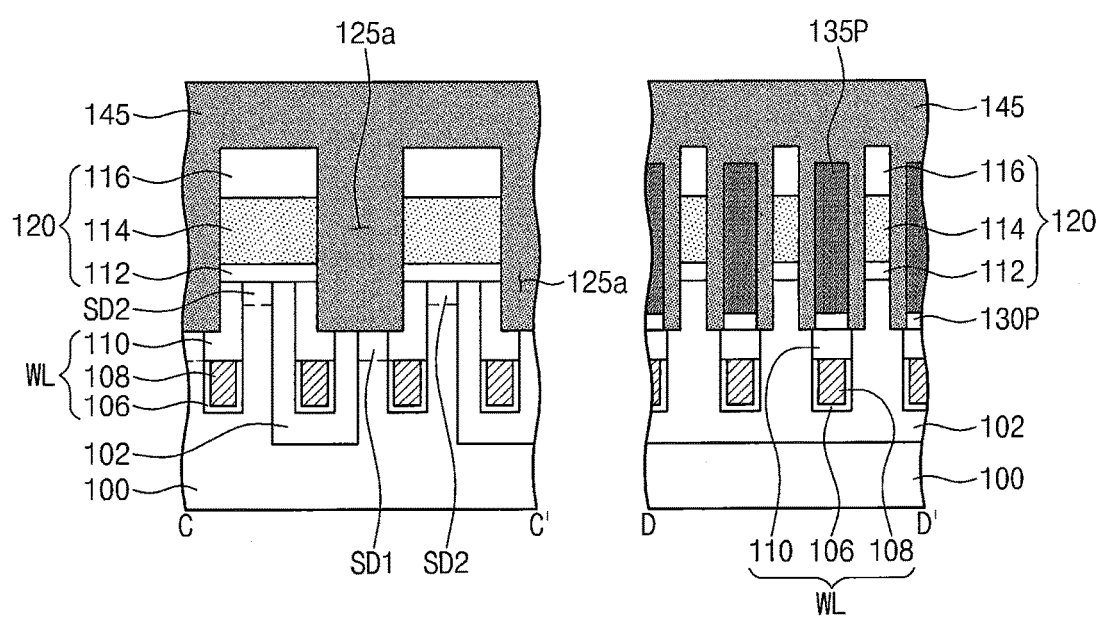

Referring to FIGS. 5A and 5C, the etch stop layer 130 may be removed. The etch stop layer 130 may be removed by performing, for example, a wet etch process. The removal of the etch stop layer 130 may expose the first impurity injection region SD1 of each of the active patterns ACT. After the etch process, the etch stop layer 130 may not be completely removed and portions of the etch stop layer 130 may remain between the substrate 100 and each of the insulation patterns 135P. The portions of the etch stop layer 130 remaining below each of the insulation patterns 135P may be defined as etch stop patterns 130P. The etch stop patterns 130P may be provided in plural, and the plurality of etch stop patterns 130P may be respectively positioned below the insulation patterns 135P. An interconnect conductive layer 145 may be formed on the substrate 100 and cover the mask patterns 120, the insulation patterns 135P, and the etch stop patterns 130P. The interconnect conductive layer 145 may fill the plurality of sub-openings 125a. The interconnect conductive layer 145 may pass through the plurality of sub-openings 125a to contact the first impurity injection region SD1 of each of the active patterns ACT. The interconnect conductive layer 145 may include at least one of, for example, doped semiconductor (e.g., doped silicon, doped germanium, etc.), conductive metal nitride (e.g., titanium nitride, tantalum nitride, etc.), metal (tungsten, titanium, tantalum, etc.), and metal-semiconductor compound (e.g., tungsten silicide, cobalt silicide, titanium silicide, etc.).

Figure 6A:
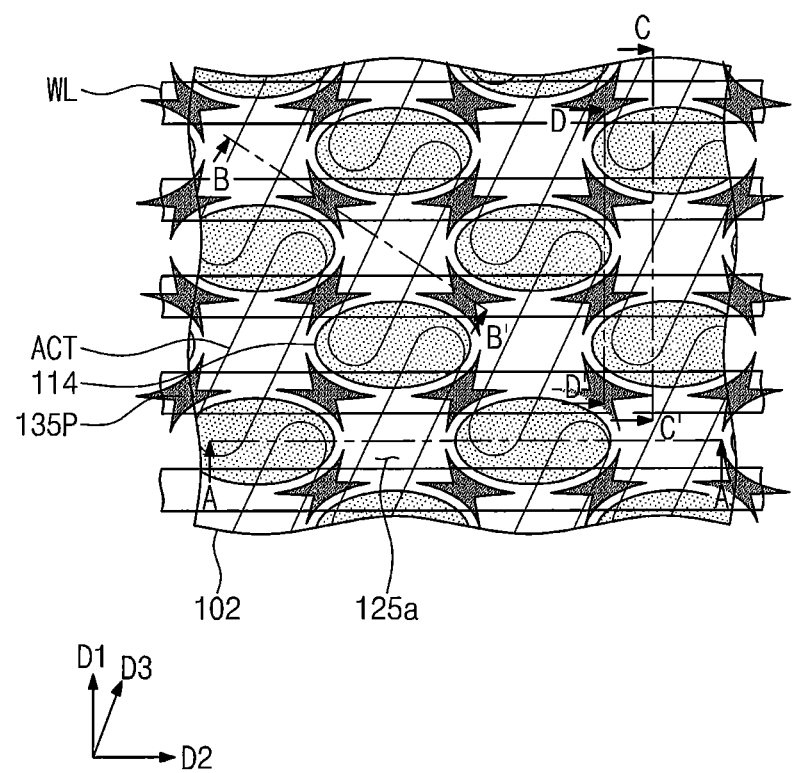
Figure 6B:
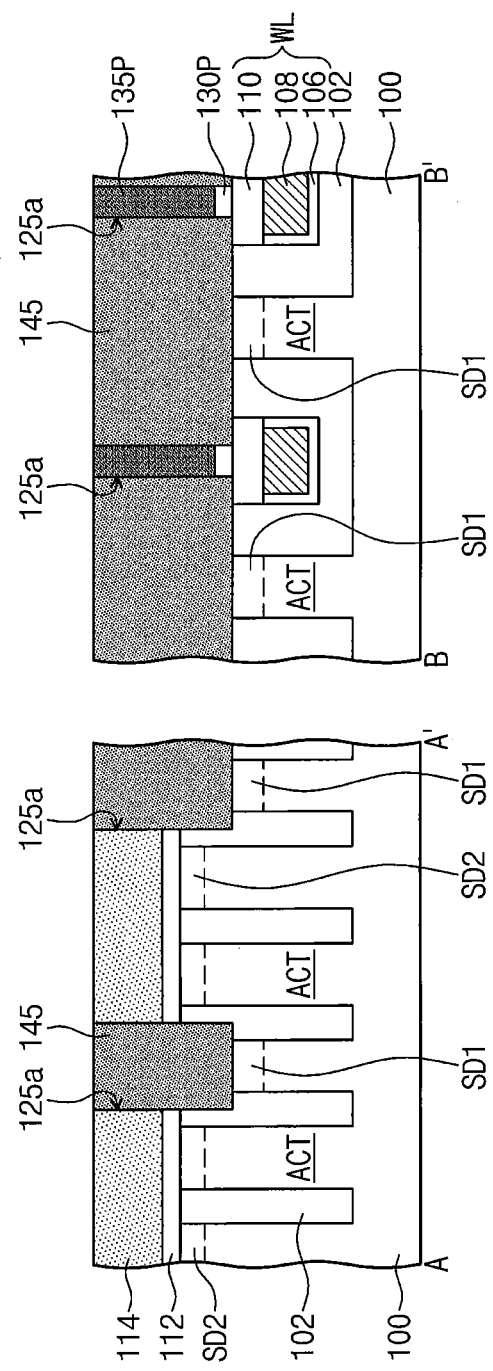
Figure 6C:
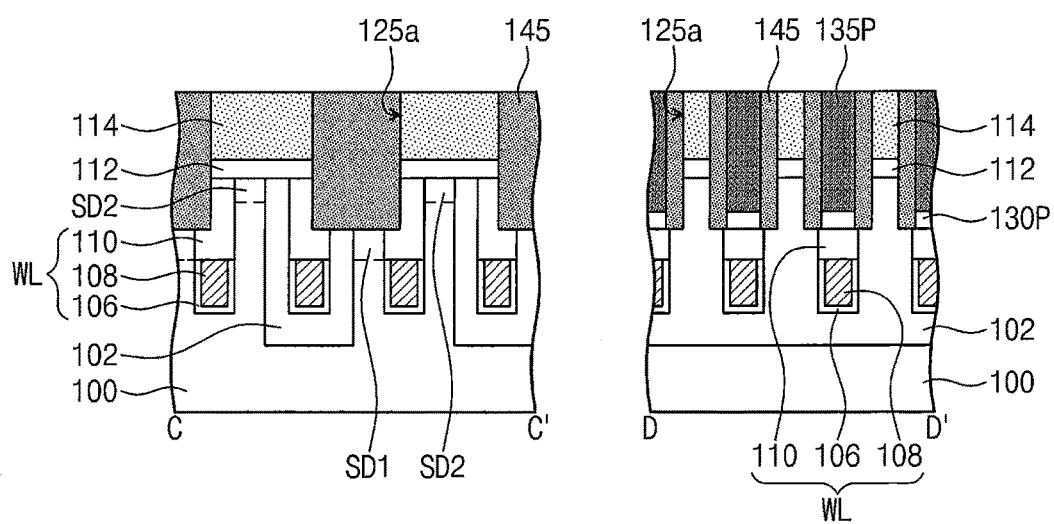

Referring to FIGS. 6A to 6C, the interconnect conductive layer 145 may be planarized until the first conductive pattern 114 of each of the mask patterns 120 is exposed. For example, the planarization of the interconnect conductive layer 145 may include dry etching the interconnect conductive layer 145 until a thickness of the interconnect conductive layer 145 is reduced to a predetermined thickness in the opening 125 defined by the mask patterns 120 and removing the hardmask pattern 116 of each of the mask patterns 120. After the planarization process, the interconnect conductive layer 145 may have a top surface substantially coplanar with a top surface of the first conductive pattern 114 of each of the mask patterns 120. During the planarization process, upper portions of the insulation patterns 135P may also be removed and top surfaces of the insulation patterns 135P may become substantially coplanar with the top surface of the interconnect conductive layer 145.

Figure 7A:
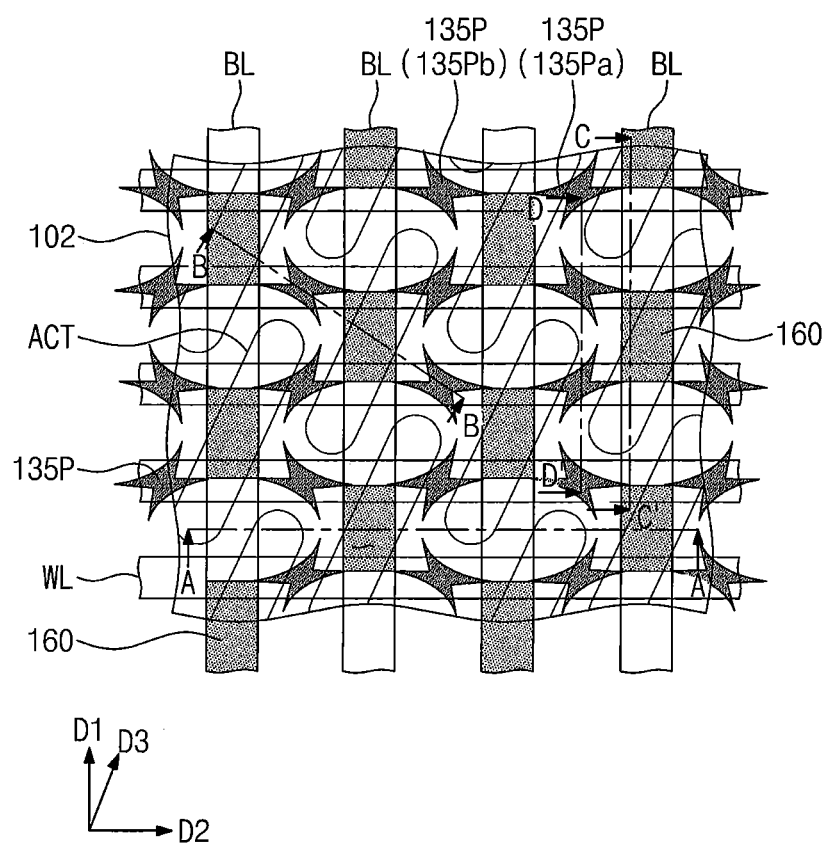
Figure 7B:
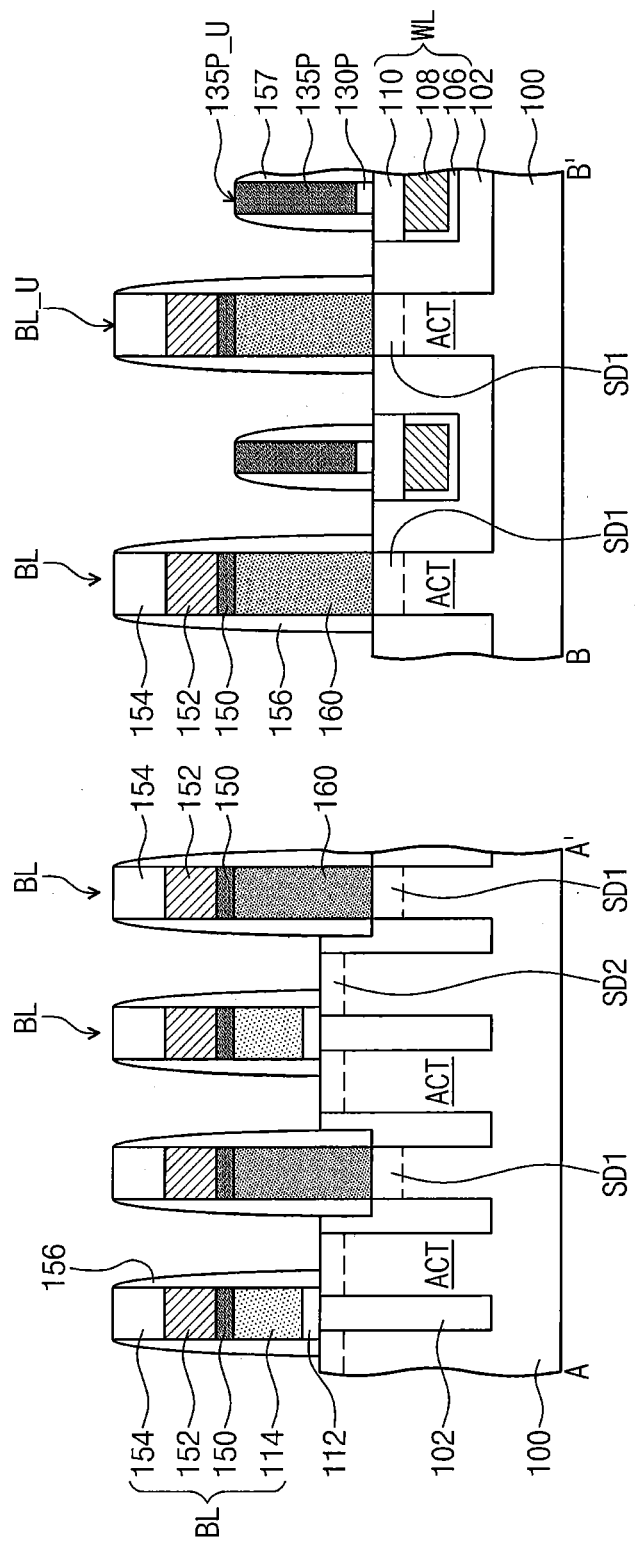
Figure 7C:
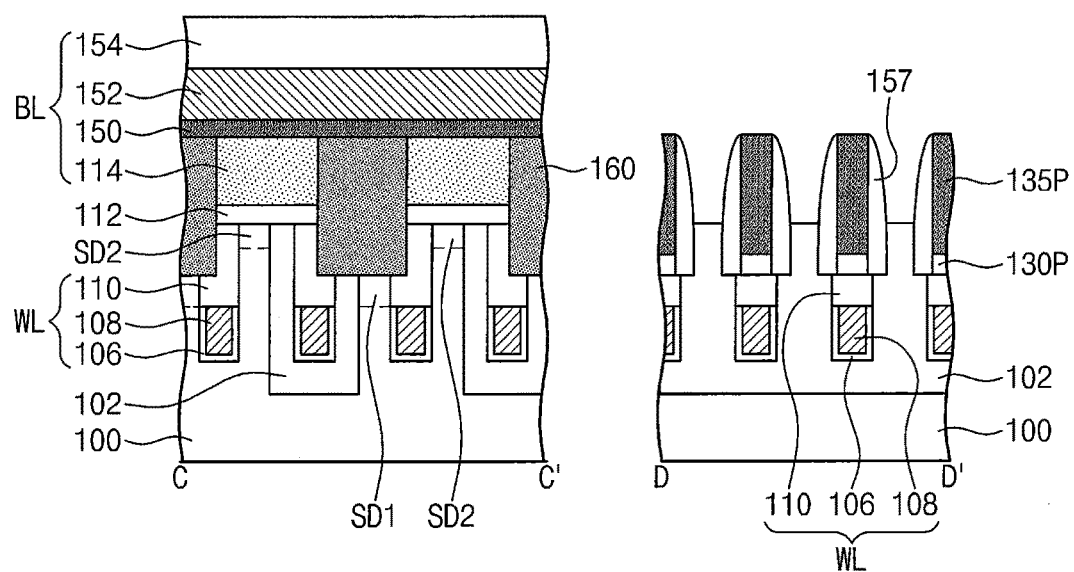

Referring to FIGS. 7A to 7C, a barrier layer and a second conductive layer may be formed on a resultant structure of FIGS. 6A to 6C. Each of the barrier layer and the second conductive layer may include one of, for example, conductive metal nitride (e.g., titanium nitride, tantalum nitride, etc.), metal (tungsten, titanium, tantalum, etc.), and metal-semiconductor compound (e.g., tungsten silicide, cobalt silicide, titanium silicide, etc.). A plurality of capping patterns 154 may be formed on the second conductive layer. The capping patterns 154 may have line shapes that extend in the first direction D1 and are spaced apart from each other in the second direction D2. Each of the capping patterns 154 may run across the first conductive pattern 114. The capping pattern 154 may include, for example, a silicon nitride layer, a silicon oxide layer, and/or a silicon oxynitride layer.

The second conductive layer, the barrier layer, the first conductive pattern 114, the lower insulation pattern 112, and the interconnect conductive layer 145 may be patterned using the capping patterns 154 as an etch mask. In detail, the second conductive layer and the barrier layer may be etched using each of the capping patterns 154 as an etch mask to form a second conductive pattern 152 and a barrier pattern 150 respectively below each of the capping patterns 154. Each of the second conductive pattern 152 and the barrier pattern 150 may have a line shape extending in the first direction D1. Moreover, the first conductive pattern 114 and the lower insulation pattern 112 may be patterned by the etch process. Therefore, opposing sidewalls of the first conductive pattern 114 and opposing sidewalls of the lower insulation pattern 112 may be aligned with opposing sidewalls of each of the capping patterns 154.

The first conductive pattern 114 may be provided in plural respectively below each of the capping patterns 154, and the plurality of first conductive patterns 114 may be arranged in the first direction D1. The barrier pattern 150 and the second conductive pattern 152 may cover the top surfaces of the plurality of first conductive patterns 114. The lower insulation pattern 112 may be provided between the substrate 100 and each of the plurality of first conductive patterns 114. Each of the capping pattern 154, the second conductive pattern 152, the barrier pattern 150, and the plurality of first conductive patterns 114 may be integrally combined to constitute a conductive line BL. The conductive line BL may be provided in plural, and the plurality of conductive lines BL may extend in the first direction D1 and be spaced apart from each other in the second direction D2. The conductive lines BL may be bit lines.

The interconnect conductive layer 145 may be patterned by the etch process and thus an interconnect contact 160 may be formed. The interconnect contact 160 may be provided in plural below the conductive line BL, and the plurality of interconnect contacts 160 may be arranged in the first direction D1. Each of the interconnect contacts 160 may be provided between a pair of the first conductive patterns 114 immediately adjacent to each other in the first direction D1. The interconnect contacts 160 may connect the first conductive patterns 114 to each other. Each of the interconnect contacts 160 may be coupled to the first impurity injection region SD1 of each of the active patterns ACT. The conductive line BL may be electrically connected to the first impurity injection region SD1 through each of the interconnect contacts 160.

During the etch process, the insulation patterns 135P and the etch stop patterns 130P may not be removed but remain on the substrate 100. The insulation patterns 135P may be provided on opposing sidewalls of the conductive line BL. The insulation patterns 135P may include first insulation patterns 135Pa that are provided on a first side of the conductive line BL and arranged in the first direction D1 and second insulation patterns 135Pb that are provided on a second side of the conductive line BL, which is opposite the first side of the conductive line BL, and arranged in the first direction D1. Each of the insulation patterns 135P may have a top surface 135P_U that is lower than a top surface BL_U of the conductive line BL relative to the upper surface of the substrate 100.

A spacer layer may be formed on the substrate 100 and may cover the conductive line BL and the insulation patterns 135P. The spacer layer may include, for example, a silicon nitride layer, a silicon oxide layer, and/or a silicon oxynitride layer. The spacer layer may be anisotropically etched to form first spacers 156 on the sidewalls of the conductive line BL and to form second spacers 157 on sidewalls of each of the insulation patterns 135P. The first spacers 156 may extend onto sidewalls of the interconnect contact 160 and sidewalls of the lower insulation pattern 112, and thus the substrate 100 may be in contact with the first spacers 156. The second spacers 157 may extend onto sidewalls of each of the etch stop patterns 130P and thus the substrate 100 may be in contact with the second spacers 157.

Referring back to FIGS. 1A to 1C, an interlayer dielectric layer 162 may be formed on the substrate 100 and may cover the conductive line BL and the insulation patterns 135P. A plurality of conductive contacts 170 may be formed in and may extend through the interlayer dielectric layer 162, such that the conductive contacts 170 may be electrically connected to the second impurity injection regions SD2 of each of the active patterns ACT. The formation of the conductive contacts 170 may include, for example, forming, in the interlayer dielectric layer 162, contact holes that respectively expose the second impurity injection regions SD2 and forming the conductive contacts 170 respectively in the contact holes. Each of the conductive contacts 170 may be electrically connected to its corresponding second impurity injection region SD2. The conductive contacts 170 may include first conductive contacts 170a that are provided on the first side of the conductive line BL and arranged in the first direction D1 and second conductive contacts 170b that are provided on the second side of the conductive line BL, which is opposite the first side of the conductive line BL, and arranged in the first direction D1. The first conductive contacts 170a and the first insulation patterns 135Pa may be alternately disposed along the first direction D1, and the second conductive contacts 170b and the second insulation patterns 135Pb may be alternately disposed along the first direction D1. Each of the conductive contacts 170 may have a top surface 170_U that is higher than the top surface 135P_U of each of the insulation patterns 135P relative to the upper surface of the substrate 100. A plurality of data storage elements 180 may be formed on the interlayer dielectric layer 162 and respectively connected to the conductive contacts 170.

In some embodiments, in a plan view, the pair of first mask patterns 120a and the pair of second mask patterns 120b may be provided to surround the first impurity injection region SD1 of each of the active patterns ACT. A region between one of the pair of first mask patterns 120a and one of the pair of second mask patterns 120b may be referred to as a narrow region. A distance between one of the pair of first mask patterns 120a and one of the pair of second mask patterns 120b may be less than a distance between the pair of first mask patterns 120a and may be less than a distance between the pair of second mask patterns 120b. As appreciated by the present inventors, if a conductive layer is formed on the substrate 100 to fill the narrow region and cover the first and second mask patterns 120a and 120b, at least a portion of the conductive layer may not be removed and remain in the narrow region when after a subsequent etch process is performed. The at least a portion of the conductive layer remaining in the narrow region may cause an electrical short between adjacent conductive contacts 170.

In some embodiments, before the interconnect layer 145 is formed on the substrate 100 to cover the first and second mask patterns 120a and 120b, the insulation pattern 135P may be formed between one of the pair of first mask patterns 120a and one of the pair of second mask patterns 120b. The insulation pattern 135P may be interposed between a pair of the conductive patterns 170 that are adjacent to each other in the first direction D1, so that the pair of the conductive patterns 170 may be free of an electrical short therebetween.

It therefore may be possible to provide a semiconductor device having improved electrical characteristics and superior reliability.

According to the present inventive concepts, the insulation pattern may be formed on the substrate to fill the narrow region between adjacent ones of the plurality of mask patterns before forming the interconnect conductive layer covering the plurality of mask patterns. As a result, it may be possible to prevent an electrical short between the pair of conductive contacts that are disposed adjacent to each other with the narrow region therebetween.

The semiconductor device may then be provided to have improved electrical characteristics and superior reliability.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a substrate including a first impurity region and a plurality of second impurity regions that are spaced apart from the first impurity region;
   a conductive line on the substrate, the conductive line extending longitudinally in a first direction in a plan view and being electrically connected to the first impurity region;
   a plurality of first conductive contacts that are on a first side of the conductive line and are spaced apart from each other in the first direction, the plurality of first conductive contacts being electrically connected to first ones of the plurality of second impurity regions, respectively;
   a plurality of first insulation patterns that are on the first side of the conductive line and are spaced apart from each other in the first direction; and
   an interconnect contact between the conductive line and the first impurity region,
   wherein the plurality of first conductive contacts and the plurality of first insulation patterns are alternately disposed along the first direction,
   wherein top surfaces of the plurality of first insulation patterns are lower than a top surface of the conductive line relative to an upper surface of the substrate,
   wherein the conductive line comprises a plurality of first conductive patterns that are spaced apart from each other in the first direction, and
   wherein the interconnect contact is between first and second ones of the plurality of first conductive patterns, and the first and second ones of the plurality of first conductive patterns are connected to each other through the interconnect contact.

2. The semiconductor device of claim 1, wherein top surfaces of the plurality of first conductive contacts are higher than the top surfaces of the plurality of first insulation patterns relative to the upper surface of the substrate.

3. The semiconductor device of claim 1, further comprising a plurality of data storage elements that are connected to the plurality of first conductive contacts, respectively.

4. The semiconductor device of claim 1, wherein the interconnect contact extends into the substrate and contacts the first impurity region.

5. The semiconductor device of claim 1, wherein a bottom surface of the interconnect contact is lower than bottom surfaces of the plurality of first conductive patterns relative to a bottom surface of the substrate.

6. The semiconductor device of claim 1, wherein the conductive line comprises:

a second conductive pattern extending on top surfaces of the plurality of first conductive patterns and a top surface of the interconnect contact and extending in the first direction; and a barrier pattern extending between the second conductive pattern and the plurality of first conductive patterns and between the interconnect contact and the second conductive pattern.

7. The semiconductor device of claim 1, further comprising a plurality of word lines in the substrate, wherein the plurality of word lines extend in a second direction traversing the first direction and are spaced apart from each other in the first direction, and wherein the first impurity region is between first and second ones of the plurality of word lines that are immediately adjacent to each other.

8. A semiconductor device comprising:

a substrate including a first impurity region and a plurality of second impurity regions that are spaced apart from the first impurity region;

a conductive line on the substrate, the conductive line extending longitudinally in a first direction in a plan view and being electrically connected to the first impurity region;

a plurality of first conductive contacts that are on a first side of the conductive line and are spaced apart from each other in the first direction, the plurality of first conductive contacts being electrically connected to first ones of the plurality of second impurity regions, respectively;

a plurality of first insulation patterns that are on the first side of the conductive line and are spaced apart from each other in the first direction, wherein the plurality of first conductive contacts and the plurality of first insulation patterns are alternately disposed along the first direction, and wherein top surfaces of the plurality of first insulation patterns are lower than a top surface of the conductive line relative to an upper surface of the substrate;

a plurality of second conductive contacts on a second side of the conductive line, which is opposite the first side of the conductive line, and arranged in the first direction, the plurality of second conductive contacts being electrically connected to second ones of the plurality of second impurity regions, respectively; and a plurality of second insulation patterns on the second side of the conductive line and arranged in the first direction, wherein the plurality of second conductive contacts and the plurality of second insulation patterns are alternately disposed along the first direction, and wherein top surfaces of the plurality of second insulation patterns are lower than the top surface of the conductive line relative to the upper surface of the substrate.

9. The semiconductor device of claim 8, wherein the top surfaces of the plurality of first insulation patterns and the top surfaces of the plurality of second insulation patterns are substantially coplanar.

10. The semiconductor device of claim 8, wherein one of the plurality of first insulation patterns and one of the plurality of second insulation patterns are arranged along a second direction that is perpendicular to the first direction.

* * * * *